(12) United States Patent
Li et al.

(10) Patent No.: US 11,972,072 B2
(45) Date of Patent: Apr. 30, 2024

(54) ELECTRONIC DEVICE

(71) Applicant: InnoLux Corporation, Miao-Li County (TW)

(72) Inventors: Shu-Fen Li, Miao-Li County (TW); Chuan-Chi Chien, Miao-Li County (TW); Hsiao-Feng Liao, Miao-Li County (TW); Rui-An Yu, Miao-Li County (TW); Chang-Chiang Cheng, Miao-Li County (TW); Po-Yang Chen, Miao-Li County (TW); I-An Yao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/978,209

(22) Filed: Nov. 1, 2022

(65) Prior Publication Data

US 2023/0168760 A1 Jun. 1, 2023

(30) Foreign Application Priority Data

Nov. 30, 2021 (CN) .......................... 202111440943.2

(51) Int. Cl.
*G06F 3/041* (2006.01)
*G02F 1/1333* (2006.01)
*H01L 27/12* (2006.01)

(52) U.S. Cl.
CPC ........ *G06F 3/0416* (2013.01); *G02F 1/13338* (2013.01); *H01L 27/124* (2013.01)

(58) Field of Classification Search
None
See application file for complete search history.

(56) References Cited

U.S. PATENT DOCUMENTS

| 2016/0042216 | A1 | 2/2016 | Yang | |
|---|---|---|---|---|
| 2016/0132176 | A1* | 5/2016 | Bae | G06F 3/0412 345/174 |
| 2018/0101712 | A1 | 4/2018 | Tsai | |
| 2021/0406508 | A1* | 12/2021 | Shih | G06V 40/1318 |

FOREIGN PATENT DOCUMENTS

| CN | 104155785 | 11/2014 |
|---|---|---|
| CN | 107918757 | 4/2018 |
| EP | 1017106 | 7/2000 |

* cited by examiner

Primary Examiner — Stephen T. Reed
(74) Attorney, Agent, or Firm — Winston Hsu

(57) ABSTRACT

The present disclosure provides an electronic device including a first sensing circuit, a second sensing circuit and a power line. The first sensing circuit includes a first sensing unit and a first transistor, and a first end of the first sensing unit is coupled to a control end of the first transistor. The second sensing circuit includes a second sensing unit and a second transistor, and a first end of the second sensing unit is coupled to a control end of the second transistor. A first end of the first transistor and a first end of the second transistor are coupled to the power line.

19 Claims, 14 Drawing Sheets

ELECTRONIC DEVICE

BACKGROUND OF THE DISCLOSURE

1. Field of the Disclosure

The present disclosure relates to an electronic device and particularly to an electronic device with a sensing circuit.

2. Description of the Prior Art

With continuous improvement of functions, electronic devices fulfill various needs of users and become necessary tools in people's lives. In conventional electronic device with both displaying function and sensing function, optical sensors may be disposed in a display region for detecting images. However, if sensing circuits respectively for controlling the optical sensors are disposed in the display region, since the number of signal lines or traces needs to be increased, pixel aperture ratio will be significantly reduced, thereby affecting display quality.

SUMMARY OF THE DISCLOSURE

An embodiment of the present disclosure provides an electronic device including a first sensing circuit, a second sensing circuit and a power line. The first sensing circuit includes a first sensing unit and a first transistor, and a first end of the first sensing unit is coupled to a control end of the first transistor. The second sensing circuit includes a second sensing unit and a second transistor. A first end of the second sensing unit is coupled to a control end of the second transistor. A first end of the first transistor and a first end of the second transistor are coupled to the power line.

Another embodiment of the present disclosure provides an electronic device including a pixel circuit and a sensing circuit. The pixel circuit includes a first transistor and a signal line, and the signal line is coupled to a first end of the first transistor. The sensing circuit includes a sensing unit, a second transistor and a third transistor, wherein a first end of the sensing unit is coupled to a control end of the second transistor, a second end of the second transistor is coupled to a first end of the third transistor, and a second end of the third transistor is coupled to the signal line.

Another embodiment of the present disclosure provides an electronic device including a sensing circuit and a touch circuit. The sensing circuit includes a sensing unit and a first transistor, and a first end of the sensing unit is coupled to a control end of the first transistor. The touch circuit includes a touch signal line, and the touch signal line is coupled to a second end of the sensing unit.

These and other objectives of the present disclosure will no doubt become obvious to those of ordinary skill in the art after reading the following detailed description of the embodiment that is illustrated in the various figures and drawings.

DETAILED DESCRIPTION

Figure 1:
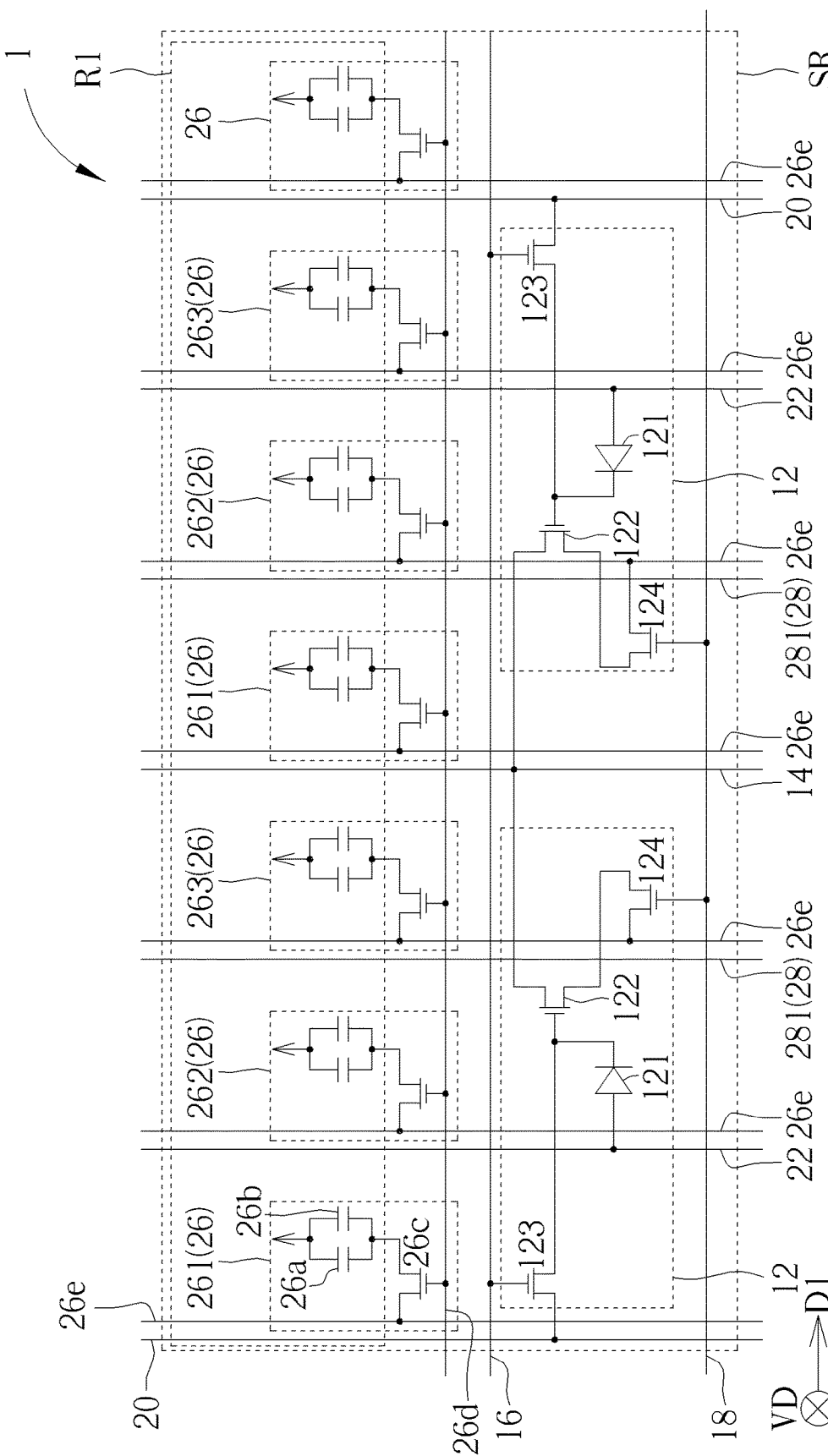
FIG. 1 schematically illustrates a circuit of an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name. Thus, a first element mentioned in the specification may be called a second element.

Spatially relative terms, such as "above", "on", "beneath", "below", "under", "left", "right", "before", "front", "after", "behind" and the like, used in the following embodiments just refer to the directions in the drawings and are not intended to limit the present disclosure. It may be understood that the elements in the drawings may be disposed in any kind of formation known by those skilled in the related art to describe or illustrate the elements in a certain way. Furthermore, when one element is mentioned to overlap another element, it may be understood that the element may partially or completely overlap the another element.

In addition, when one element or layer is "on" or "above" another element or layer, it may be understood that the element or layer is directly on the another element or layer, and alternatively, another element or layer may be between the one element or layer and the another element or layer (indirectly). On the contrary, when the element or layer is "directly on" the another element or layer, there is no intervening element or layer between the element or layer and the another element or layer.

As disclosed herein, when one element is referred to as being "electrically connected to" or "coupled to" another element, it will be understood that intervening elements may be between the element and the another element and electrically connect the element to the another element, and alternatively, the element may be directly electrically connected to the another element without intervening elements existing between them. If one element is referred to as being "directly electrically connected to" or "directly coupled to" another element, there are no intervening elements present between them.

As disclosed herein, the terms "approximately", "essentially", "about", "substantially", and "same" generally mean within 10%, 5%, 3%, 2%, 1%, or 0.5% of the reported numerical value or range. The quantity disclosed herein is an approximate quantity, that is, without a specific description of "approximately", "essentially", "about", "substantially", and "same", the quantity may still include the meaning of "approximately", "essentially", "about", "substantially", and "same".

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness and width may be measured by using an optical microscope (OM), an electron microscope or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

In the present disclosure, the electronic device may have a sensing function and may optionally include a displaying, optical sensing, image detecting, touching sensing or antenna function, other suitable functions or any combination thereof, but not limited thereto. The electronic device may include liquid crystal molecules, light emitting diode (LED), a quantum dot material, a fluorescent material, a phosphor material, other suitable materials, or any combination thereof, but not limited thereto. The LED may for example include organic light emitting diode (OLED), micro light emitting diode (micro-LED) or mini light emitting diode (mini-LED), or quantum dot light emitting diode (e.g., QLED or QDLED), but not limited thereto. In addition, the electronic device may be a color display device, a single color display device, or a grayscale display device. The appearance of the electronic device may be rectangular, circular, polygonal, a shape with curved edges, curved or other suitable shapes, but not limited thereto. The electronic device may optionally have peripheral systems such as a driving system, a control system, alight source system, etc.

Refer to FIG. 1, which schematically illustrates a circuit of an electronic device according to a first embodiment of the present disclosure. As shown in FIG. 1, the electronic device 1 may have a sensing region SR and include at least one sensing circuit 12 and at least one power line 14 that are disposed in the sensing region SR. In FIG. 1, the electronic device 1 may include two sensing circuits 12 as an example for illustration, but not limited thereto. The two sensing circuits 12 may be adjacent to each other, but not limited thereto. Each sensing circuit 12 may include a sensing unit 121 and a transistor 122, in which a first end of the sensing unit 121 may be coupled to a control end of the transistor 122, such that the transistor 122 may be used for amplifying signals detected by the sensing unit 121. The transistor 122 may be used as an amplifying transistor of the sensing circuit 122, and a first end, a second end and the control end of the transistor 122 may serve as a drain(or source), a source(or drain) and a gate of the transistor, but not limited thereto. In the embodiment of FIG. 1, the term "coupled to" may refer to "electrically connected to", but not limited thereto. Furthermore, the first ends of the transistors 122 of the two sensing circuit 12 may be coupled to the same power line 14, such that the number of the power line 14 in the electronic device 1 may be saved.

In some embodiments, the sensing unit 121 may be used to detect light, such as X-ray, visible light, infrared light or other suitable light, but not limited thereto. The sensing unit 121 may for example include a photodiode, other photosensitive elements used in a fingerprint sensor, an iris sensor, a retina sensor, a face sensor, a vein sensor, a movement sensor, a gesture sensor, or other suitable sensors, or a combination of at least two thereof. In other embodiments, the sensing unit 121 may include touch sensing. In some embodiments, when the electronic device 1 includes a plurality of sensing circuits 12 arranged in an array, the electronic device 1 may detect images. The sensing region SR may be a region where the electronic device 1 is capable of detecting images or a region covered by the sensing circuit 12, but not limited thereto.

In the embodiment of FIG. 1, the sensing circuits 12 may for example be arranged along the first direction D1, and the power lines 14 may extend along the second direction D2 and be disposed between the sensing circuits 12, but not limited thereto. The first direction D1 may be for example perpendicular to the second direction D2, but not limited thereto. In some embodiments, two sensing circuits 12 of the plurality of sensing circuits 12 may be symmetrical to each other with respect to the power line 14 and be disposed on both sides of the power line 14, but not limited thereto.

Further, in the embodiment of FIG. 1, each sensing circuit 12 may further include a transistor 123 and a transistor 124, and the electronic device 1 may further include a signal line 16, a signal line 18, two power lines 20 and two signal lines 22. A first end of the transistor 123 may be coupled to the control end of the transistor 122 and the first end of the sensing unit 121, and a control end and a second end of the transistor 123 may be respectively coupled to the signal line 16 and one of the power lines 20, and the signal line 16 may for example provide a reset signal such that the transistor 123 may be used to reset a voltage at the control end of the transistor 122. The transistor 123 may for example be a reset transistor in the sensing circuit 12, and the first end, the second end and the control end of the transistor 123 may for example be a source(or drain), a drain(or source) and a gate, but not limited thereto. A first end of the transistor 124 may be coupled to the second end of the transistor 122, and a control end of the transistor 124 may be coupled to the signal line 18, so that the transistor 124 may be used to output a signal generated by the sensing unit 121 to another signal line (e.g., one signal line 26e shown in FIG. 1) under control of the signal line 18, in which the signal is output to another signal line. The transistor 124 may be for example a readout transistor in the sensing circuit 12, and the first end, the second end and the control end of the transistor 124 may be for example a source(or drain), a drain(or a source) and a gate, but not limited thereto. A second end of the sensing unit 121 may be coupled to one of the signal lines 22. In some embodiments, the signal line 22 may provide a bias voltage. The first end and the second end of the sensing unit 121 may be for example a cathode and an anode of the photodiode, but not limited thereto. In the embodiment of FIG. 1, the signal line 16 and the signal line 18 may extend along the first direction D1, and the power lines 20 and the signal lines 22 may extend along the second direction D2 and cross the signal line 16 and the signal line 18. In some embodiments, one of the signal lines 22 may be disposed between one of the power lines 20 and the power line 14, so that the power lines 20 respectively coupled to different sensing circuits 12 may be symmetrical to each other with respect to the power line 14 and be disposed on both sides of the power line 14, and the power lines 22 respectively coupled to different sensing circuits 12 may be symmetrical to each other with respect to the power line 14 and be disposed on both sides of the power line 14, but not limited thereto. In some embodiments, the sensing circuit 12 may not be limited to that shown in FIG. 1, and the number of transistors, the connection of the transistors and/or the connection of the transistors with the sensing units may be adjusted and/or other suitable elements may be added to the sensing circuit according to requirements; for example, a capacitor may be electrically connected in parallel between the cathode and the anode of the sensing unit 121, but not limited thereto. In some embodiments, the number of the sensing circuits 12 of the electronic device 1 is not limited to that shown in FIG. 1 and may include a plurality of sensing circuits 12. In such case, the numbers of the signal lines 16, the signal lines 18, the power lines 20 and the signal lines 22 may be adjusted according to the number of the sensing circuits 12.

As shown in FIG. 1, the electronic device 1 may further include at least one pixel circuit 26 disposed in the sensing region SR and used for displaying images. In the embodiment of FIG. 1, the electronic device 1 may include a plurality of pixel circuits 26, but not limited thereto. In other words, the sensing region SR of the electronic device 1 may further have a function of displaying images and serve as a display region of the electronic device 1. For example, one of the sensing circuits 12 may correspond to three pixel circuits 26 and be located on one side of the pixel circuits 26. In some embodiments, when the pixel circuits 26 are arranged in an array, the sensing circuits 12 may be disposed between adjacent rows of the pixel circuits 26.

In the embodiment of FIG. 1, the pixel circuit 26 may for example correspond to a pixel or a sub-pixel of the electronic device 1. When the electronic device 1 is capable of displaying color images, the pixel circuit 26 may for example include a plurality of pixel circuits 261, a plurality of pixel circuits 262 and a plurality of pixel circuits 263 respectively corresponding to sub-pixels of different colors. For example, one of the pixel circuits 261, one of the pixel circuits 262 and one of the pixel circuits 263 may correspond to a red sub-pixel, a green sub-pixel and a blue sub-pixel respectively, so that the pixel circuit 261, the pixel circuit 262 and the pixel circuit 263 may correspond to a pixel capable of displaying white light, but not limited thereto. In some embodiments, one of the pixel circuits 261, one of the pixel circuits 262 and one of the pixel circuits 263 may correspond to sub-pixels of different colors, respectively. The pixel circuits 261, the pixel circuits 262 and the pixel circuits 263 may be alternately arranged in sequence along the first direction D1, but not limited thereto.

The electronic device 1 in FIG. 1 is a liquid crystal display device as an example, but not limited thereto. One of the pixel circuits 26 of the electronic device 1 may include a transistor 26c and a signal line 26e. The second end of the transistor 124 of one of the sensing circuits 12 may be coupled to the signal line 26e of a corresponding one of the pixel circuits 26, so that the second end of the transistor 124 and the corresponding transistor 26c may be coupled to the same signal line 26e, and the transistor 124 of one of the sensing circuits 12 and the transistor 26c of the corresponding pixel circuit 26 may share the same signal line 26e to transmit signals. Accordingly, number of signal lines or traces disposed in the sensing region SR may be reduced, thereby increasing aperture ratio of the pixel or sub-pixel. For example, when two adjacent sensing circuits 12 are symmetrically disposed on both sides of the power line 14 and each of which correspond to three pixel circuits 26, the transistor 124 of one of the sensing circuits 12 may be coupled to the signal line 26e of the pixel circuit 263, and the transistor 124 of another of the sensing circuits 12 may be coupled to the signal line 26e of the pixel circuit 262, but not limited thereto. In the embodiment of FIG. 1, the signal line 26e may be, for example, a data line, and the pixel circuits 26 in the same column may share the same signal line 26e, but not limited thereto.

In addition, as shown in FIG. 1, one of the pixel circuits 26 may further include a capacitor 26a, a capacitor 26b, and a signal line 26d. In one of the pixel circuits 26, a control end and a first end of the transistor 26c may be respectively coupled to the signal line 26d and the signal line 26e, so that a voltage of the pixel electrode may be controlled through the switching of the transistor 26c. A first end, a second end and a control end of the transistor 26c may be, for example, a source(or drain), a drain(or a source) and a gate, but not limited thereto. In the embodiment of FIG. 1, the signal line 26d may be for example a scan line, and the pixel circuits 26 in the same row may share the same signal line 26d, but not limited thereto. The capacitor 26a and the capacitor 26b may be coupled in parallel, in which first ends of the capacitor 26a and the capacitor 26b may be coupled to the second end of the transistor 26c, and second ends of the capacitor 26a and the capacitor 26b may be coupled to a common voltage or a common electrode (e.g., a common electrode 58b shown in FIG. 4). For example, the capacitor 26a may be a liquid crystal capacitor formed of a pixel electrode (e.g., a pixel electrode 62a shown in FIG. 4), a common electrode and a liquid crystal layer (not shown), and the capacitor 26b may be a storage capacitor, but not limited thereto. The electronic device 1 may have an opening region R1 located in the sensing region SR, and the opening region R1 may be a region that allows light to pass through. In the embodiment of FIG. 1, the capacitors 26a and the capacitors 26b of the pixel circuits 26 may be disposed in the opening region R1, but not limited thereto. In some embodiments, the electronic device 1 may be, for example, a non-self-luminous display device of another type or a self-luminous display device. The pixel circuits 26 may not be limited to circuits shown in FIG. 1. For example, when the electronic device 1 is the self-luminous display device, one of the pixel circuits 26 may for example at least include the signal line 26d, the signal line 26e, two transistors, a capacitor and a light emitting unit, but not limited thereto. The light emitting unit may include, for example, an OLED, a quantum light emitting diode (QLED or QDLED), an inorganic LED, other suitable light emitting elements or any combination thereof. The inorganic LED may include mini LED or micro LED, but not limited thereto.

Figure 9:
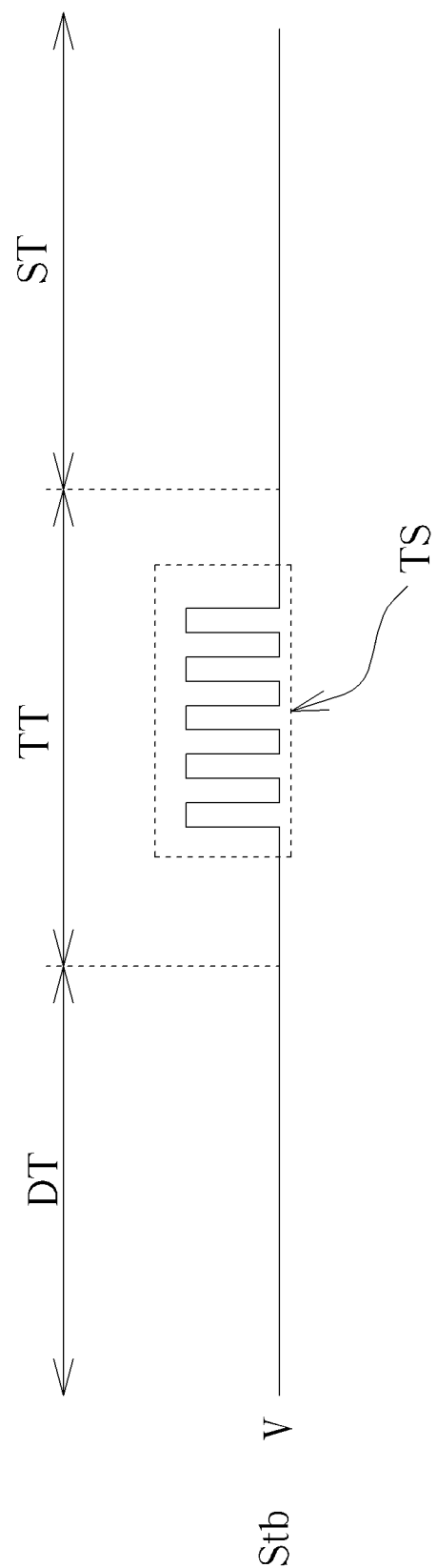
FIG. 9 schematically illustrates a timing sequence of a signal provided to the touch signal line.

As shown in FIG. 1, the electronic device 1 may further include a touch circuit 28 for transmitting a signal for controlling a touch device, thereby detecting position of an object touching the electronic device 1. The touch circuit 28 may include a touch signal line 281 for transmitting a driving signal or a sensing signal, and the touch signal line 281 may be disposed on one side of the corresponding signal line 26e and extend along the second direction D2. In the embodiment of FIG. 1, the touch signal line 281 may be disposed between one of the signal lines 22 and the power line 14, but not limited thereto. In some embodiments, the touch signal line 281 and one of the signal lines 22 may transmit the same signal, for example, the signal Stb as shown in FIG. 9, but not limited thereto.

Figure 2:
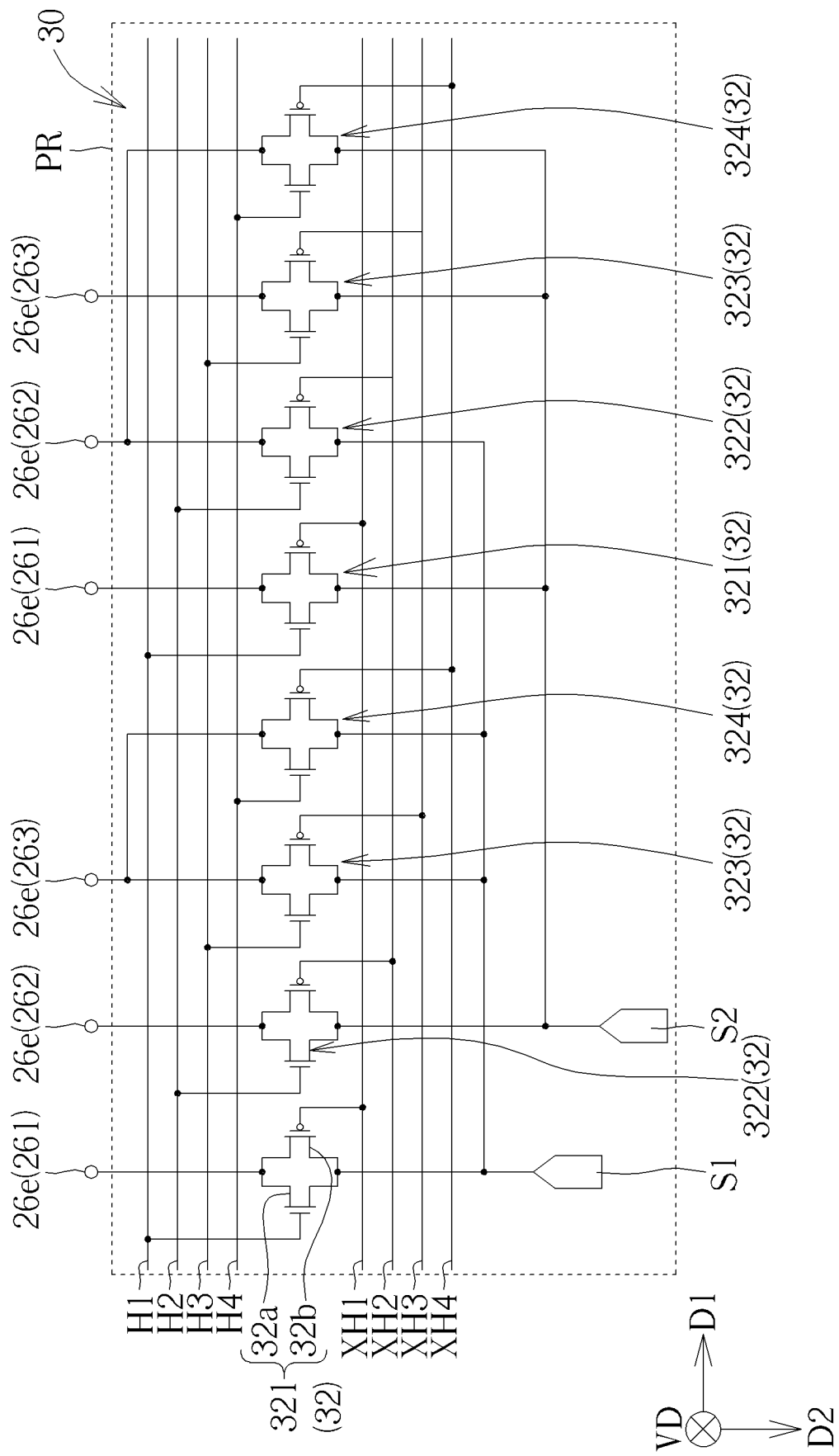
FIG. 2 schematically illustrates a demultiplexer (De-MUX) circuit according to some embodiments of the present disclosure.
Figure 3:
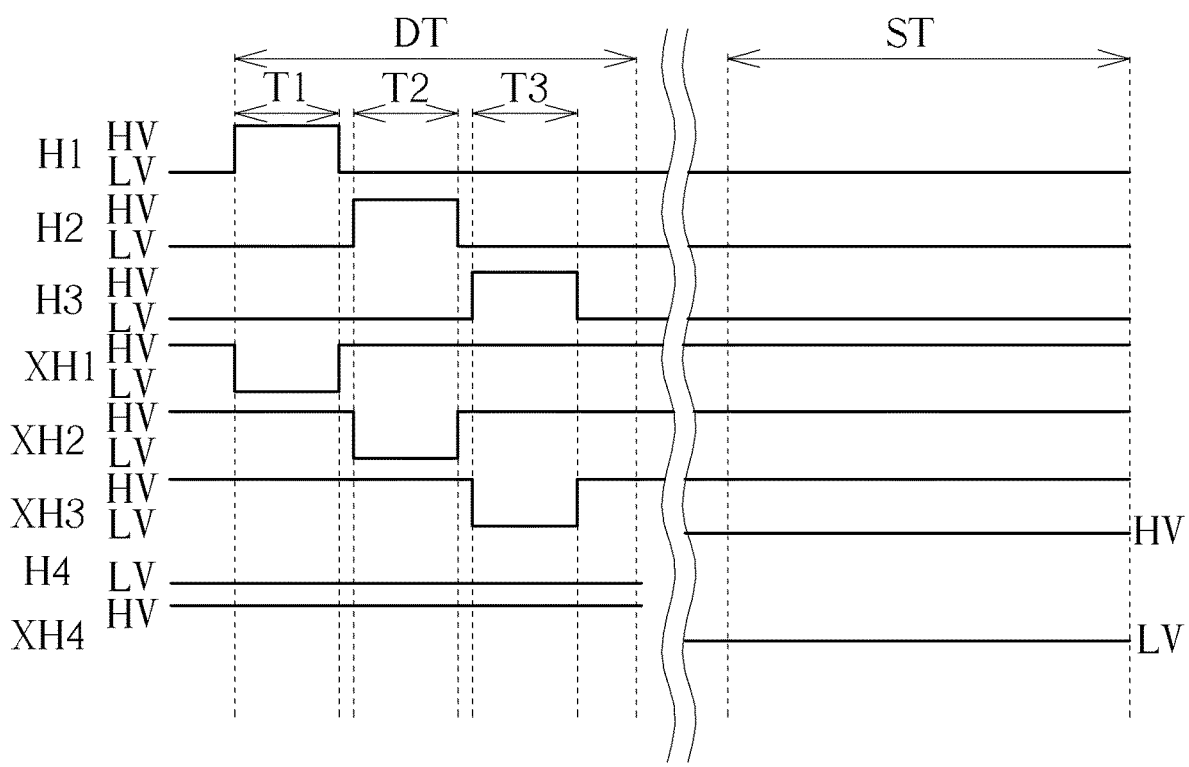
FIG. 3 schematically illustrates a signal timing sequence of the demultiplexer circuit.

The following description further details how to transmit signals to the transistor 124 of one of the sensing circuits 12 and the transistor 26c of one of the pixel circuits 26. FIG. 2 schematically illustrates a demultiplexer (DeMUX) circuit according to some embodiments of the present disclosure, and FIG. 3 schematically illustrates a signal timing sequence of the demultiplexer circuit. As shown in FIG. 2, the demultiplexer circuit 30 may for example be disposed in a peripheral region PR on a side of the sensing region SR, so that one of the transistors 124 and the corresponding transistor 26c may share the same signal line 26e as shown in FIG. 1. The demultiplexer circuit 30 may include a plurality of transistor groups 32, and each transistor group 32 may include an n-type transistor 32a and a p-type transistor 32b, in which a first end of the n-type transistor 32a and a first end of the p-type transistor 32b are coupled to each other, and a second end of the n-type transistor 32a is coupled to a second end of the p-type transistor 32b. Moreover, each signal line 26e may be coupled to the first end of the n-type transistor 32a of a corresponding one of the transistor groups 32, and the second ends of the n-type transistors 32a of the transistor groups 32 may be coupled to at least one signal end.

Specifically, in the embodiment of FIG. 2, the transistor groups 32 may include a plurality of transistor groups 321, a plurality of transistor groups 322, a plurality of transistor groups 323, and a plurality of transistor groups 324. In each transistor group 321, a control end of the n-type transistor 32a may receive a forward switching signal H1, a control end of the p-type transistor 32b may receive a reverse switching signal XH1, and the first end of the n-type transistor 32a may be coupled to the signal line 26e of the corresponding pixel circuit 261. In each transistor group 322, a control end of the n-type transistor 32a may receive a forward switching signal H2, a control end of the p-type transistor 32b may receive a reverse switching signal XH2, and the first end of the n-type transistor 32a may be coupled to the signal line 26e of the corresponding pixel circuit 262. In each transistor group 323, a control end of the n-type transistor 32a may receive a forward switching signal H3, a control end of the p-type transistor 32b may receive a reverse switching signal XH3, and the first end of the n-type transistor 32a may be coupled to the signal line 26e of the corresponding pixel circuit 263. In the embodiment of FIG. 2, the transistor groups 321, the transistor groups 322 and the transistor groups 323 may be alternately arranged in sequence along the first direction D1, but not limited thereto. In such case, as counted from one side (e.g., a left side) of the demultiplexer circuit 30 in a manner of excluding the transistor groups 324 from the counting, the second ends of the n-type transistors 32a of the odd-numbered transistor groups 32 may be coupled to a signal terminal S1, and the second ends of the n-type transistors 32a of the even-numbered transistor groups 32 may be coupled to a signal terminal S2. For example, in FIG. 2, as counted from the left side of the demultiplexer circuit 30, a first one of the transistor groups 321, a first one of the transistor groups 323 and a second one of the transistor groups 322 may be coupled to the signal terminal S1, and a first one of the transistor groups 322, a second one of the transistor groups 321 and a second one of the transistor groups 323 may be coupled to the signal terminal S2. Through this connection, different voltage levels may be transmitted (e.g., the high voltage level and the low voltage level or the low voltage level and the high voltage level may be respectively transmitted in the same frame) by the signal terminal S1 and the signal terminal S2 respectively, so that the sub-pixels of the electronic device 1 may display in a dot inversion or column inversion manner. In adjacent frames, the voltage levels of the signal terminal S1 and the signal terminal S2 may be interchanged with each other, but not limited thereto. The connection of the transistor groups 32 and the pixel circuits 26 of the present disclosure is not limited to the mentioned above. In some embodiments, the connection between the transistor groups 32 and the pixel circuits 26 may be adjusted according to the arrangement of the pixel circuits 26. In some embodiments, the second ends of the transistor groups 321, the transistor groups 322 and the transistor groups 323 of the demultiplexer circuit 30 may be coupled to the same signal terminal (e.g., the signal terminal S1 or the signal terminal S2), but not limited thereto.

In one of the transistor groups 324 shown in FIG. 2, a control end of the n-type transistor 32a may receive a forward switching signal H4, a control end of the p-type transistor 32b may receive a reverse switching signal XH4, and the first end of the n-type transistor 32a may be coupled to the signal line 26e that is coupled to one of the sensing circuits 12. For example, when two adjacent sensing circuits 12 are symmetrical to the power line 14 disposed therebetween, a first one of the transistor groups 324 may be coupled to the signal line 26e coupled to the corresponding pixel circuit 263, and a second one of the transistor groups 324 may be coupled to the signal line 26e coupled to the corresponding pixel circuit 262 when counted from a side (e.g., the left side) of the demultiplexer circuit 30, but not limited thereto. The signal lines 26e coupled to the transistor groups 324 of the present disclosure may be altered according to the arrangement of the pixel circuits 26 and the signal lines 26e shared by the sensing circuits 12 and the pixel circuits 26. Also, as counted from a side (e.g., the left side) of the demultiplexer circuit 30, the second ends of the n-type transistors 32a of the odd-numbered transistor groups 324 may be coupled to the signal terminal S1, and the second ends of the n-type transistors 32a of the even-numbered transistor groups 324 may be coupled to the signal terminal S2, so that the signal terminal S1 and the signal terminal S2 may be used for receiving the sensing signals from the sensing circuits 12, but not limited thereto. In some embodiments, as counted from the left side of the demultiplexer circuit 30, the odd-numbered transistor groups 324 may be coupled to the signal terminal S2, and the even-numbered transistor groups 324 may be coupled to the signal terminal S1, but not limited thereto. In some embodiments, the second ends of the transistor groups 324 of the demultiplexer circuit 30 may be coupled to the same signal terminal (e.g., the signal terminal S1 or the signal terminal S2), but not limited thereto.

The following contents further exemplify the operation of the demultiplexer circuit 30, but the present disclosure is not limited thereto. As shown in FIG. 1 to FIG. 3, the demultiplexer circuit 30 may transmit a display signal to the pixel circuits 26 during a display driving period DT to perform image display and receive the sensing signals during a sensing period ST to perform sensing (e.g., optical sensing). Since the display driving period DT and the sensing period ST do not overlap, the electronic device 1 may achieve the functions of displaying images and sensing images. Specifically, the display driving period DT may include a first period T1, a second period T2 and a third period T3. The forward switching signal H1 may be at the high voltage level HV in the first period T1, so that the n-type transistors 32a of the transistor groups 321 are turned on. Accordingly, data signals of the signal terminal S1 and the signal terminal S2 may be transmitted to the corresponding pixel circuits 261 by different transistor groups 321 respectively. The forward switching signal H2 may be at the high voltage level HV in the second period T2, so that the n-type transistors 32a of the transistor groups 32 are turned on. Accordingly, the data signals of the signal terminal S1 and the signal terminal S2 may be transmitted to the corresponding pixel circuits 262 by different transistor groups 322 respectively. The forward switching signal H3 may be at the high voltage level HV in the third period T3, so that the n-type transistors 32a of the transistor groups 323 are turned on. Accordingly, the data signals of the signal terminal S1 and the signal terminal S2 may be transmitted to the corresponding pixel circuits 263 by different transistor groups 323 respectively. Through the above operations, the signal lines 26e coupled to the transistor groups 321, the transistor groups 322 and the transistor groups 323 may receive the data signals from the signal terminal S1 and the signal terminal S2 respectively, such that the pixel circuits 26 shown in FIG. 1 may display an image.

Similarly, the reverse switching signal XH1 may be at the low voltage level LV in the first period T1, so that the p-type transistors 32b of the transistor groups 321 are turned on. The reverse switching signal XH2 may be at the low voltage level LV in the second period T2, so that the p-type transistors 32b of the transistor groups 322 are turned on. The reverse switching signal XH3 may be at the low voltage level LV in the third period T3, so that the p-type transistors 32b of the transistor groups 323 are turned on. Therefore, the data signals of the signal terminal S1 and the signal terminal S2 may be respectively transmitted to the corresponding pixel circuits 26 through different transistor groups 32 in different time periods.

In the embodiment of FIG. 3, the first period T1, the second period T2 and the third period T3 may for example not overlap each other and be performed sequentially, but not limited thereto. In some embodiments, an order of the first period T1, the second period T2 and the third period T3 may be other permutations of the first period T1, the second period T2 and the third period T3.

In addition, in the display driving period DT, the forward switching signal H4 may be at the low voltage level LV, and the reverse switching signal XH4 may be at the high voltage level HV, so that the n-type transistors 32a and the p-type transistors 32b of the transistor groups 324 may be turned off.

In the sensing period ST of FIG. 3, the forward switching signal H1, the forward switching signal H2 and the forward switching signal H3 are all at the low voltage level LV, and the reverse switching signal XH1, the reverse switching signal XH2 and the reverse switching signal XH3 are all at the high voltage level HV, so that the n-type transistors 32a and the p-type transistors 32b of the transistor groups 321, the transistor groups 322 and the transistor groups 323 are all turned off. At the same time, the forward switching signal H4 is at the high voltage level HV, and the reverse switching signal XH4 is at the low voltage level LV, so the n-type transistors 32a and the p-type transistors 32b of the transistor groups 324 are turned on, and then the sensing signals may be received from the corresponding sensing circuits 12 by the signal terminal S1 and the signal terminal S2.

Figure 4:
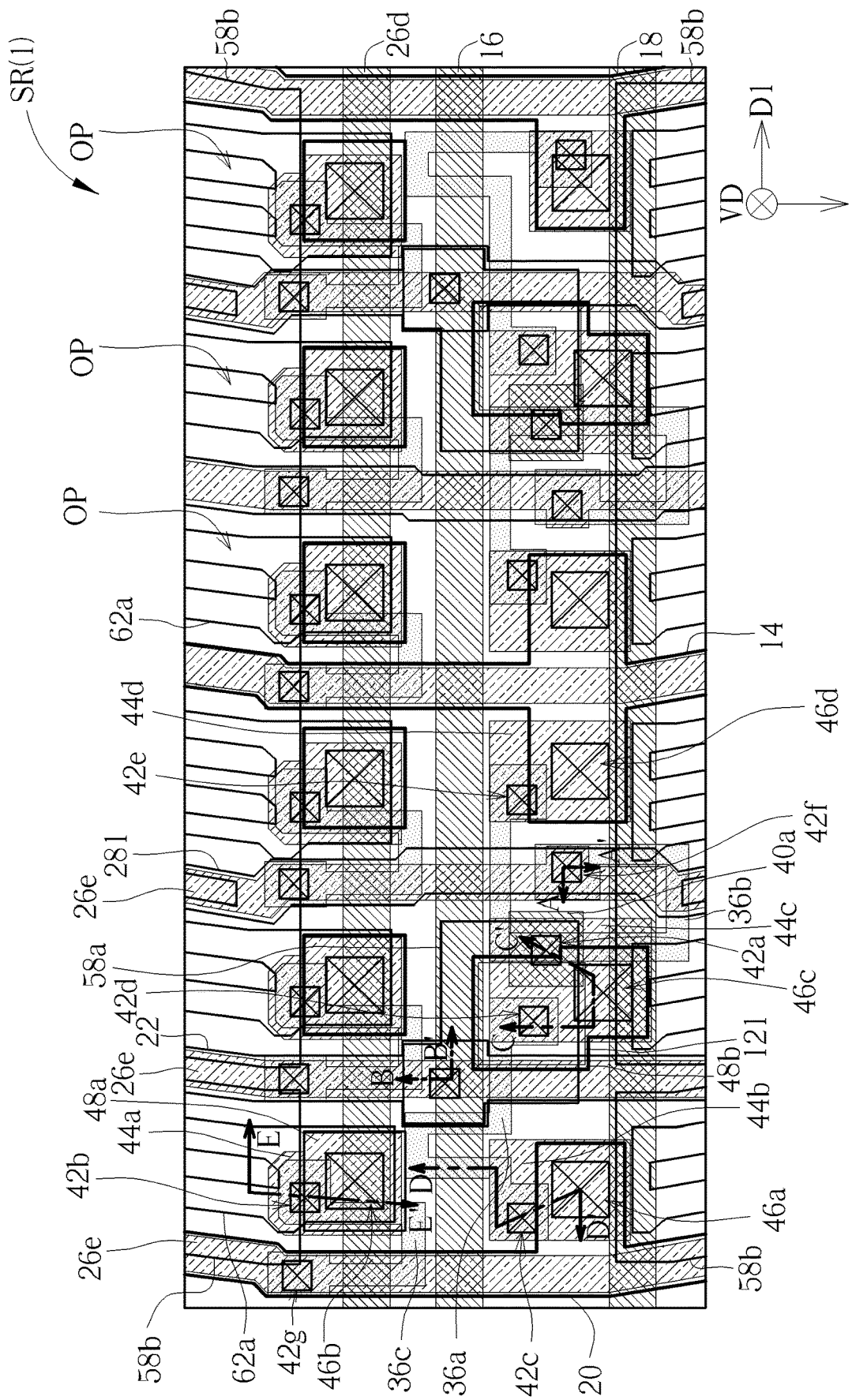
FIG. 4 schematically illustrates a top-view structure of the electronic device in the sensing region according to the first embodiment of the present disclosure.
Figure 5:
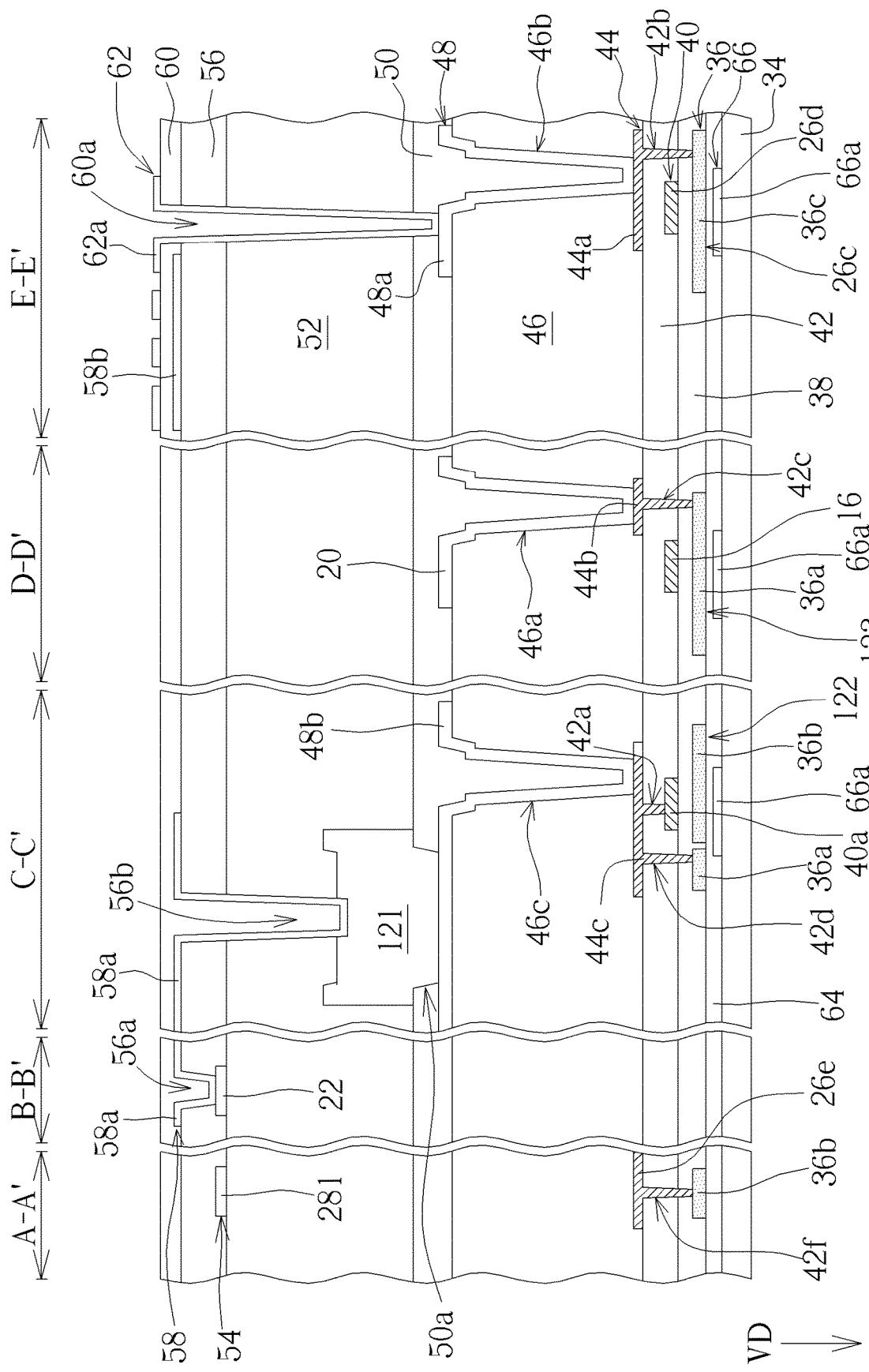
FIG. 5 schematically illustrates cross-sectional views of the electronic device shown in FIG. 4 respectively taken along a line A-A', a line B-B', a line C-C', a line D-D' and a line E-E' according to the first embodiment of the present disclosure.

FIG. 4 schematically illustrates a top-view structure of the electronic device in the sensing region according to the first embodiment of the present disclosure, and FIG. 5 schematically illustrates cross-sectional views of the electronic device shown in FIG. 4 respectively taken along a line A-A', a line B-B', a line C-C', a line D-D' and a line E-E' according to the first embodiment of the present disclosure. In FIG. 4, the structure of the electronic device 1 corresponds to the two sensing circuits 12 and the six pixel circuits 26 shown in FIG. 1 as an example, but not limited thereto. In FIG. 4, since positions of elements of different sensing circuits may be substantially symmetrical to the power line 14, the following description takes the elements of one of the sensing circuits located on the left side of the power line 14 as an example, but not limited thereto. As shown in FIG. 4 and FIG. 5, the electronic device 1 of this embodiment may include a substrate 34, a semiconductor layer 36, an insulating layer 38, a metal layer 40, an insulating layer 42, a metal layer 44, an insulating layer 46, a metal layer 48, an insulating layer 50, the sensing unit 121, an insulating layer 52, a metal layer 54, an insulating layer 56, a transparent conductive layer 58, an insulating layer 60, and a transparent conductive layer 62. The semiconductor layer 36 may be disposed on the substrate 34 and may include a semiconductor block 36a, a semiconductor block 36b and a plurality of semiconductor blocks 36c. The insulating layer 38 may be disposed on the semiconductor layer 36 and serve as gate insulating layers of the transistors 122, the transistors 123 and the transistors 124 in the sensing circuit 12 shown in FIG. 1 and gate insulating layers of the transistors 26c in the pixel circuits 26. The metal layer 40 may be disposed on the insulating layer 38 and may for example include the signal line 26d, the signal line 16, the signal line 18 and an electrode 40a. The signal line 26d, the signal line 16 and the signal line 18 may extend along the first direction D1 and be sequentially arranged along the second direction D2. The sensing circuits arranged in the first direction D1 may share the same signal line 16 and the same signal line 18. In a top view direction VD of the electronic device 1, the semiconductor block 36a may overlap the signal line 16, such that a portion of the signal line 16 may be used as a gate (the control end) of one of the transistors 123, and a portion of the semiconductor block 36a overlapping the signal line 16 may serve as a channel of the one of the transistors 123. Portions of the semiconductor block 36a that does not overlap the metal layer 40 (or the signal line 16) may include doped semiconductor, and end portions of the semiconductor block 36a adjacent to its two ends may serve as the first end (the drain or source) and the second end (the source or drain) of the one of the transistors 123. The semiconductor block 36b may overlap the electrode 40a and the signal line 18, so that the electrode 40a and the signal line 18 may serve as a gate (the control end) of one of the transistors 122 and a gate (the control end) of one of the transistors 124. Also, a portion of the semiconductor block 36b overlapping the electrode 40a may serve as a channel of the one of the transistors 122, and a portion of the semiconductor block 36b overlapping the signal line 18 may serve as a channel of the one of the transistors 124. Portions of the semiconductor block 36b that does not overlap the metal layer 40 may include doped semiconductor. Portions of the semiconductor block 36b located on two sides of the electrode 40a in the top view direction VD may serve the first end (the drain or source) and the second end (the source or drain) of the one of the transistors 122. A portion of the semiconductor block 36b located between the electrode 40a and the signal line 18 may serve as the first end of the one of the transistors 124, and an end portion of the semiconductor block 36b adjacent to the signal line 18 may serve as the second end of the one of the transistors 124. One of the semiconductor blocks 36c may overlap the signal line 26d, so that a portion of the signal line 26d may serve as a gate (the control end) of one of the transistors 26c, and a portion of the one of the semiconductor blocks 36c overlapping the signal line 26d may serve as a channel of the one of the transistors 26c. Portions of the one of the semiconductor blocks 36c that does not overlap the metal layer 40 may include doped semiconductor, and end portions of the one of the semiconductor blocks 36c adjacent to its two ends may serve the first end (the source or drain) and the second end (the drain or source) of the one of the transistors 26c. In the embodiment of FIG. 4, the electrode 40a may be disposed between the signal line 16 and the signal line 18, but not limited thereto. The top view direction VD may be for example a normal direction perpendicular to a top surface of the substrate 34, but not limited thereto.

As shown in FIG. 4 and FIG. 5, the insulating layer 42 may be disposed on the metal layer 40, and the metal layer 44 may be disposed on the insulating layer 42. The metal layer 44 may include a plurality of signal lines 26e, a plurality of electrodes 44a, an electrode 44b, an electrode 44c, and an electrode 44d. As shown in a part of FIG. 5 taken along the line C-C' of FIG. 4, the insulating layer 42 may have a through hole 42a, and the electrode 44c may extend into the through hole 42a and be coupled to the electrode 40a. The insulating layer 38 and the insulating layer 42 may further have a plurality of through holes 42b, a through hole 42c, a through hole 42d, a through hole 42e, a through hole 42f, and a plurality of through holes 42g. One of the electrodes 44a may extend into the corresponding through hole 42b and be coupled to one end portion of the corresponding semiconductor block 36c (the second end of the corresponding transistor 26c), as shown in a part of FIG. 5 taken along the line E-E' of FIG. 4, and a portion of one of the signal lines 26e may extend into one of the through holes 42g and be coupled to another end portion of the corresponding semiconductor block 36c (the first end of the corresponding transistor 26c). The electrode 44b may extend into the through hole 42c and be coupled to one end portion of the semiconductor block 36a (the second end of one of the transistors 123), as shown in a part of FIG. 5 taken along the line D-D' of FIG. 4, and the electrode 44c may extend into the through hole 42d and be coupled to another end portion of the semiconductor block 36a (the first end of the one of the transistors 123), as shown in the part of FIG. 5 taken along the line C-C' of FIG. 4, and the electrode 44d may extend into the through hole 42e and coupled to one end portion of the semiconductor block 36b (the first end of one of the transistors 122). A portion of one of the signal lines 26e coupled to one of the sensing circuits may extend into the through hole 42f and be coupled to another end portion of the semiconductor block 36b (the second end of one of the transistors 124), as shown in a part of FIG. 5 taken along the line A-A' of FIG. 4, so that one of the signal lines 26e corresponding to the same one of the sensing circuits (e.g., the sensing circuit 12 shown in FIG. 1) may be coupled to both the sensing circuit and one of the pixel circuits (e.g., the pixel circuit 26 shown in FIG. 1) through the through hole 42f and one of the through holes 42g, thereby reducing the number of the signal lines in the electronic device 1.

In the embodiment of FIG. 5, one of the transistors may be, for example, a top-gate type thin film transistors. The structure of the electronic device 1 of the present disclosure is not limited to this and may be adjusted according to the type of the transistors. In some embodiments, one of the transistors may be, for example, a bottom-gate type thin film transistor, or may be altered to a double-gate type transistor, other suitable transistors, or any combination thereof depending on requirements.

As shown in FIG. 4 and FIG. 5, the insulating layer 46 may be disposed on the metal layer 44 and have a through hole 46a, a plurality of through holes 46b, a through hole 46c, and a through hole 46d. The metal layer 48 may be disposed on the insulating layer 46 and include the power line 20, a plurality of electrodes 48a, an electrode 48b and the power line 14. The power line 20 may extend into the through hole 46a and be coupled to the electrode 44b and further coupled to the second end of one of the transistors 123. In the embodiment of FIG. 4, the power line 20 may overlap the corresponding signal line 26e and the electrode 44b in the top view direction VD, and the power line 20 may be electrically insulated from one of the signal lines 26e overlapping the power line 20 by the insulating layer 46. One of the electrodes 48a may extend into one of the through holes 46b and be coupled to the corresponding electrode 44a. The electrode 48b may extend into the through hole 46c and be coupled to the electrode 44c, so as to be coupled to the first end of one of the transistors 123. The power line 14 may extend into the through hole 46d and be coupled to the electrode 44d, so as to be coupled to the first end of one of the transistors 122. In the embodiment of FIG. 4, the power line 14 may overlap the corresponding signal line 26e and the electrode 44d in the top view direction VD, and the power line 14 may be electrically insulated from the corresponding signal line 26e overlapped with the power line 14 by the insulating layer 46.

In the embodiment of FIG. 5, the insulating layer 46 may include, for example, a planarization layer and a protecting layer sequentially disposed on the metal layer 44 and the insulating layer 42, but not limited thereto. In some embodiments, the insulating layer 46 may be adjusted to a single-layer structure or a multi-layer structure according to requirements.

As shown in FIG. 4 and FIG. 5, the insulating layer 50 may be disposed on the metal layer 48 and have a through hole 50a. The sensing unit 121 may be disposed on the insulating layer 50 and coupled to the electrode 48b through the through hole 50a. When the sensing unit 121 includes a photodiode, the sensing unit 121 may for example include an electrode, a photoelectric conversion layer, and an electrode (not shown) sequentially disposed on the insulating layer 50, but not limited thereto. The insulating layer 52 may be disposed on the sensing unit 121 and the insulating layer 50. In the embodiment of FIG. 5, the insulating layer 52 may include, for example, a planarization layer and a protecting layer sequentially disposed on the sensing unit 121 and the insulating layer 50, but not limited thereto. In some embodiments, the insulating layer 52 may be adjusted to a single-layer structure or a multi-layer structure according to requirements. The metal layer 54 may be disposed on the insulating layer 52 and include the signal line 22 and the touch signal line 281. In the embodiment of FIG. 4, the signal line 22 may overlap the corresponding signal line 26e in the top view direction VD, but not limited thereto. The touch signal line 281 may overlap the corresponding signal line 26e in the top view direction VD, but not limited thereto. In some embodiments, the signal line 22 may overlap the electrode 48b in the top view direction VD, so as to reduce opaque area in the sensing region SR, but not limited thereto.

As shown in FIG. 4 and FIG. 5, the insulating layer 56 may be disposed on the metal layer 54 and have a through hole 56a, and the insulating layer 56 and the insulating layer 52 may have a through hole 56b to expose the sensing unit 121. The transparent conductive layer 58 may be disposed on the insulating layer 56 and include a connecting electrode 58a. The connecting electrode 58a may extend into the through hole 56a to be coupled to the signal line 22 and extend into the through hole 56b to be coupled to the exposed sensing unit 121, so that the sensing unit 121 may be coupled to the signal line 22 through the connecting electrode 58a. In the embodiment of FIG. 5, the transparent conductive layer 58 may further include a common electrode 58b disposed on the insulating layer 56. The insulating layer 60 may be disposed on the transparent conductive layer 58, and the insulating layer 60, the insulating layer 56, the insulating layer 52 and the insulating layer 50 may have a plurality of through holes 60a, each of which exposing one of the electrodes 48a coupled to one of the transistors 26c. The transparent conductive layer 62 may be disposed on the insulating layer 60 and may include a plurality of pixel electrodes 62a. One of the pixel electrodes 62a may extend into one of the through holes 60a to be coupled to one of the electrodes 48a, so as to be further coupled to the second end of the one of the transistors 26c. Through the structure mentioned above, the sensing circuits and the pixel circuits may be integrated in the sensing region SR, so that the electronic device 1 may have both the sensing function and the displaying function.

As shown in FIG. 4, adjacent two of the signal lines 26e, one of the signal lines 26d and one of the signal lines 18 may surround an opening OP to allow light to pass through, and the opening OP may form the opening region R1 shown in FIG. 1. In the top view direction VD, one of the pixel electrodes 62a and the common electrode 58b may be disposed in the corresponding opening OP to control the transmittance of the liquid crystal layer corresponding to the opening OP, but not limited thereto. The pixel aperture ratio of the electronic device 1 may for example be a ratio of a sum of areas of all the openings OP in the top view direction VD to an area of the sensing region SR in FIG. 1, but not limited thereto.

In some embodiments, the semiconductor layer 36 may for example include amorphous silicon, polycrystalline silicon, single crystal silicon, oxide semiconductor, other suitable semiconductors, or any combination thereof, but not limited thereto. The insulating layer 38, the insulating layer 42, the insulating layer 46, the insulating layer 50, the insulating layer 52, the insulating layer 56, and the insulating layer 60 may for example include silicon oxide, silicon nitride, organic materials, other suitable materials, or any combination thereof, but not limited thereto. The metal layer 40, the metal layer 44, the metal layer 48, and the metal layer 58 may for example include aluminum, molybdenum nitride, copper, titanium, other suitable materials, or any combination thereof, but not limited thereto. The transparent conductive layer 58 and the transparent conductive layer 62 may for example include indium tin oxide, indium zinc oxide, other suitable transparent conductive materials, or any combination thereof, but not limited thereto.

In some embodiments, when the electronic device 1 is a self-luminous display device and includes light emitting units coupled to the transistors 26c, the part of the electronic device 1 shown in FIG. 5 taken along the line E-E' may be adjusted based on requirements. In such case, the pixel aperture ratio may be for example a ratio of a sum of the areas of all the light emitting units in the top view direction VD to the area of the sensing region SR in FIG. 1, but not limited thereto.

As shown in FIG. 5, in some embodiments, the electronic device 1 may optionally further include a buffer layer 64 disposed between the semiconductor layer 36 and the substrate 14. The buffer layer 64 may for example be used to block moisture, oxygen or ions from entering the semiconductor layer 36. The buffer layer 64 may be a single layer or a multiple-layer structure, and a material of the buffer layer 64 may include, for example, silicon nitride, silicon oxide, silicon oxynitride, aluminum oxide, resin, other suitable materials, or any combination thereof, but not limited thereto. In some embodiments, the electronic device 1 may optionally further include a light shielding layer 66 for shielding the channels of the transistors. The light shielding layer 66 may be disposed between the buffer layer 64 and the substrate 14, but not limited thereto. The light shielding layer 66 may include a plurality of light shielding patterns 66a, and the light shielding patterns 66a at least partially overlap the semiconductor layer 36 and the metal layer 40 in the top view direction VD. Specifically, as shown in FIG. 4 and FIG. 5, at least one light-shielding pattern 66a may at least partially overlap the semiconductor block 36a and the signal line 16, at least another light-shielding pattern 66a may at least partially overlap the semiconductor block 36b, the electrode 40a and the signal line 18, and at least another light shielding pattern 66a may at least partially overlap the semiconductor blocks 36c and the signal line 26d, but not limited thereto.

It should be noted that by coupling the transistors 122 of two adjacent sensing circuits 12 to the same power line 14, the number of the power lines 14 disposed along the second direction D2 in the electronic device 1 may be reduced, thereby improving an accommodation space of the electronic device 1 in the first direction D1 and/or increasing the pixel aperture ratio of the electronic device 1. In some embodiments, the transistor 124 of one of the sensing circuits 12 is coupled to the corresponding signal line 26e of the pixel circuit 26, so that the number of the signal lines disposed along the second direction D2 in the electronic device 1 may be significantly reduced, and the pixel aperture ratio of electronic device 1 may be increased. In some embodiments, by the power line 20, the signal line 22, the touch signal line 281 and/or the power line 14 overlapped with the corresponding signal lines 26e in the top view direction VD, the pixel aperture ratio may also be improved.

Figure 6:
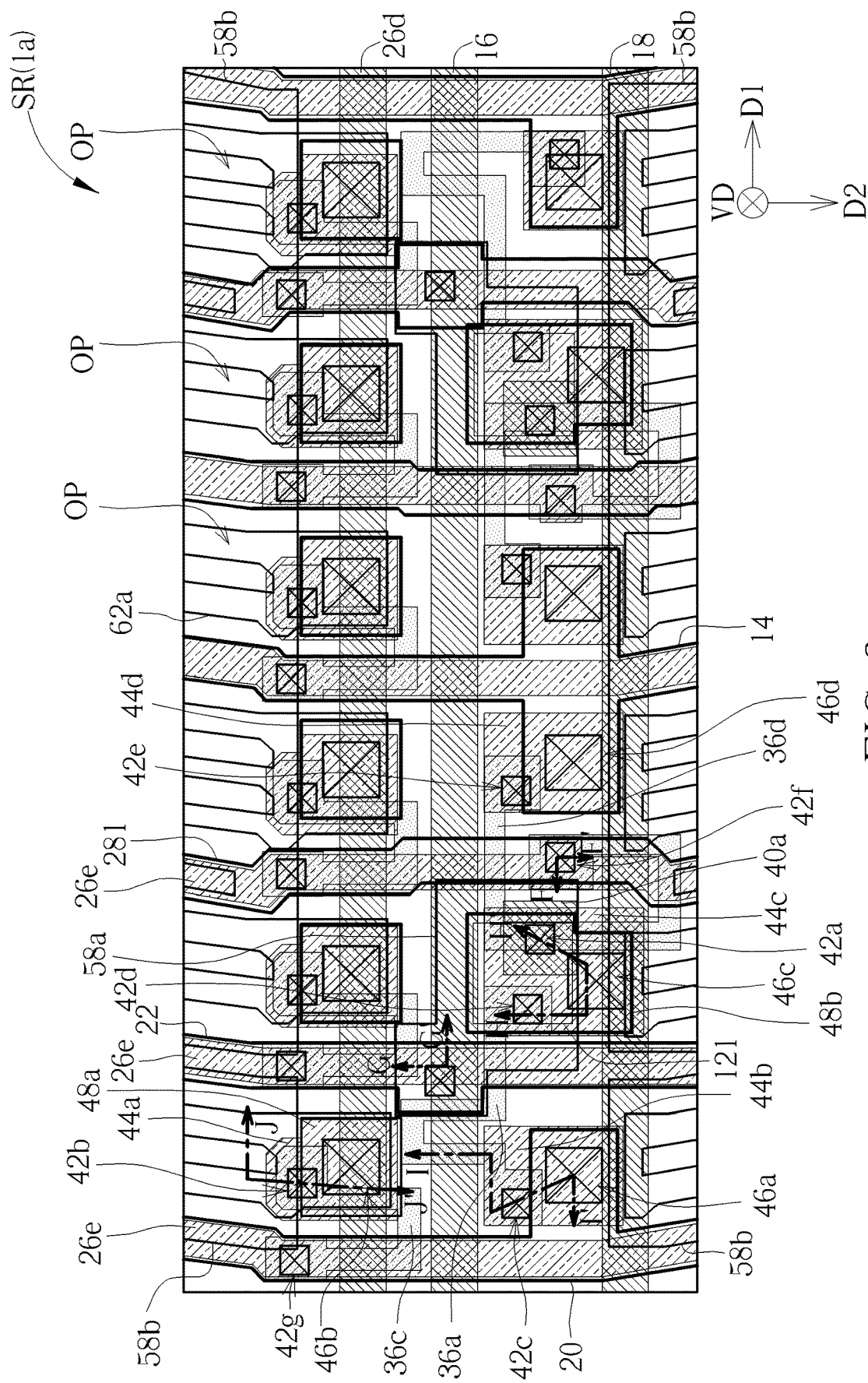
FIG. 6 schematically illustrates a top view structure of an electronic device according to a variant embodiment of the first embodiment of the present disclosure.
Figure 7:
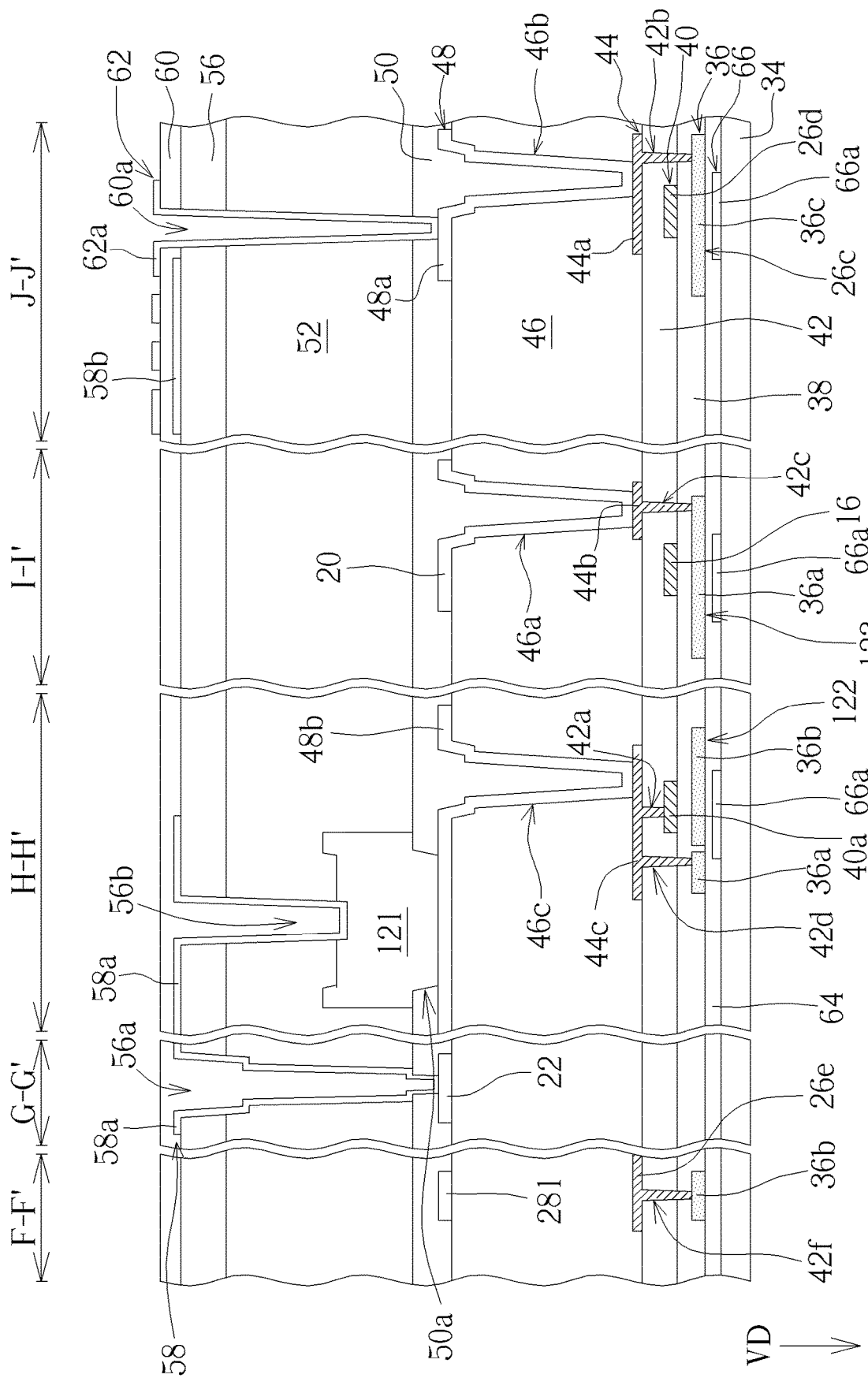
FIG. 7 schematically illustrates cross-sectional structures of the electronic device taken along a line F-F', a line G-G', a line H-H', a line I-I' and a line J-J' of FIG. 6 according to the variant embodiment of the first embodiment of the present disclosure.

FIG. 6 schematically illustrates a top view structure of an electronic device according to a variant embodiment of the first embodiment of the present disclosure, and FIG. 7 schematically illustrates cross-sectional structures of the electronic device taken along a line F-F', a line G-G', a line H-H', a line I-I' and a line J-J' of FIG. 6 according to the variant embodiment of the first embodiment of the present disclosure. As shown in FIG. 6 and FIG. 7, the electronic device 1a of the present variant embodiment differs from the electronic device 1 of FIG. 4 and FIG. 5 in that the electronic device 1a may not include the metal layer 54. In this case, as shown in parts of FIG. 7 taken along the line F-F' and the line G-G' in FIG. 6, the metal layer 48 may further include the signal line 22 and the touch signal line 281. In the embodiment of FIG. 7, since the signal line 22 is located in the metal layer 48, the through hole 56a may penetrate through the insulating layer 56, the insulating layer 52 and the insulating layer 50 to expose the signal line 22, and the connecting electrode 58a may extend into the through hole 56a to be coupled to the signal line 22. Accordingly, the sensing unit 121 may be coupled to the signal line 22 through the connecting electrode 58a. In the embodiment of FIG. 6, the signal line 22 and the electrode 48b may be separated from each other in the top view direction VD. The structures and circuits of other parts of the electronic device 1a of the present variant embodiment may be similar to or the same as the electronic device 1 shown in FIG. 1, FIG. 4 and FIG. 5 and will not be redundantly detailed.

The electronic device of the present disclosure is not limited to the above-mentioned embodiments and may have different embodiments. In order to simplify the description, the different embodiments below use the same reference numerals to denote the same elements as the above-mentioned embodiments. In order to clearly illustrate the different embodiments, the following description focuses on differences between the embodiments, and same parts will not be repeated again.

Figure 8:
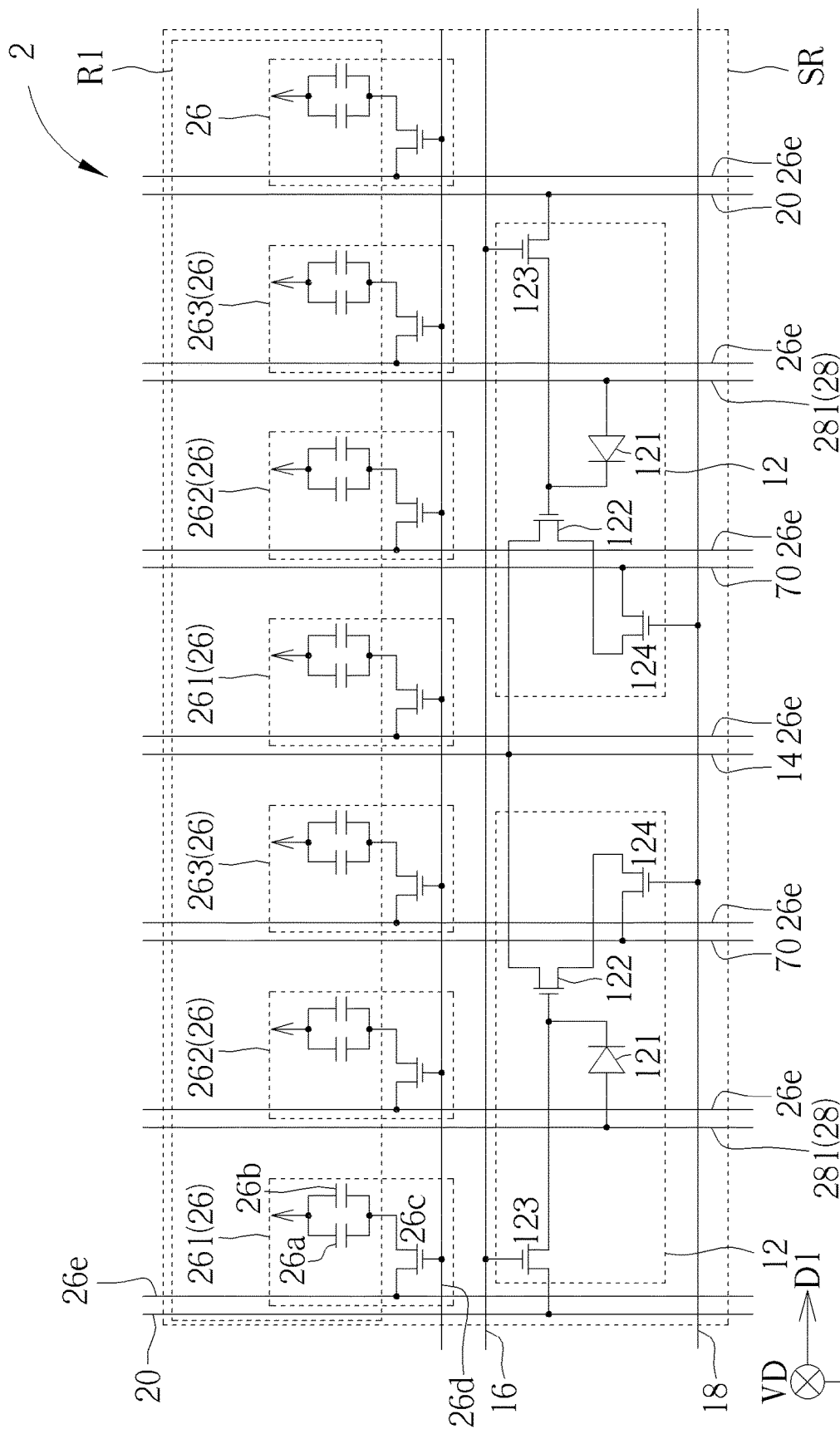
FIG. 8 schematically illustrates a circuit of an electronic device according to a second embodiment of the present disclosure.

FIG. 8 schematically illustrates a circuit of an electronic device according to a second embodiment of the present disclosure. As shown in FIG. 8, the electronic device 2 of this embodiment differs from the electronic device shown in FIG. 1 in that the touch signal line 281 of this embodiment may be used to transmit the bias signal of the signal line 22 of FIG. 1 and the touch signal of the touch signal line of FIG. 1. Since the bias signal and the touch signal may for example be the same, the bias line and the touch signal line in this embodiment may be integrated into the same touch signal line 281, thereby decreasing a space for disposing the signal lines along the second direction D2. Thus, the pixel aperture ratio of the electronic device 2 may be improved. The touch signal line 281 may be coupled to the second end of the sensing unit 121 and be included in the touch circuit 28. In the embodiment of FIG. 8, the electronic device 2 may further include a readout line 70, for example extending along the first direction D1, and the second end of one of the transistors 124 is coupled to the readout line 70 instead of the signal lines 26e. The readout line 70 may be disposed between the touch signal line 281 and the power line 14, but not limited thereto. Other parts of circuits of the electronic device 2 in this embodiment may for example be similar to or the same as the electronic device 1 shown in FIG. 1 and thus will not be described in detail.

FIG. 9 schematically illustrates a timing sequence of a signal provided to the touch signal line. As shown in FIG. 9, the electronic device 2 may provide a signal Stb to the touch signal line 281. The signal Stb may be maintained at a fixed voltage V, such as a common voltage, during the display driving period DT and the sensing period ST and may have a touch signal TS during the touch period TT, in which the touch signal TS may include, for example, a plurality of pulses. In the embodiment of FIG. 9, the display driving period DT, the touch period TT and the sensing period TS may be alternately performed in sequence, but not limited thereto. It should be noted that by integrating the bias signal and the touch signal into the signal Stb, the signal line 22 of FIG. 1 may be integrated into the touch signal line 281, thereby increasing the pixel aperture ratio of the electronic device 2.

Figure 10:
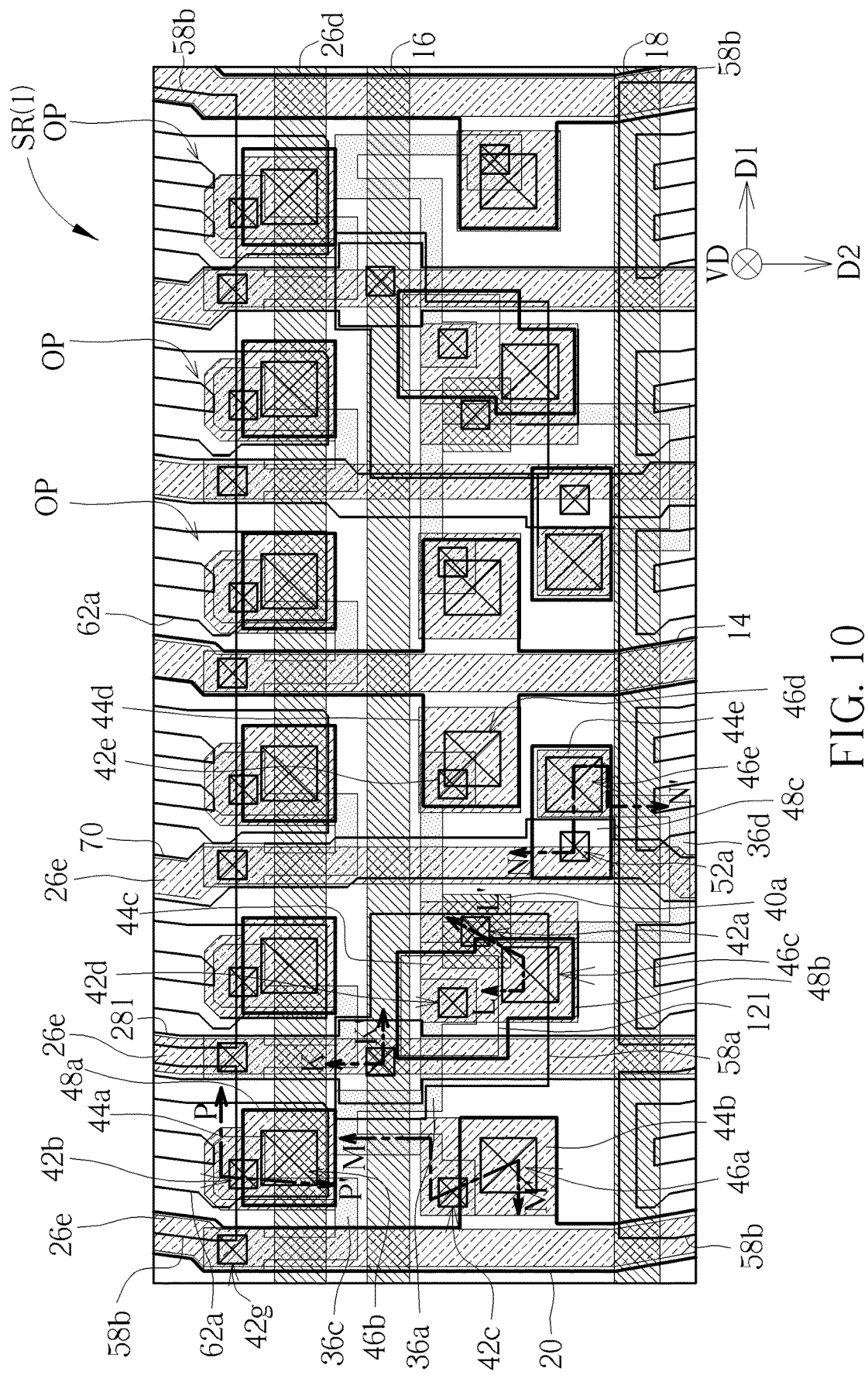
FIG. 10 schematically illustrates a top view structure of the electronic device in the sensing region according to the second embodiment of the present disclosure.
Figure 11:
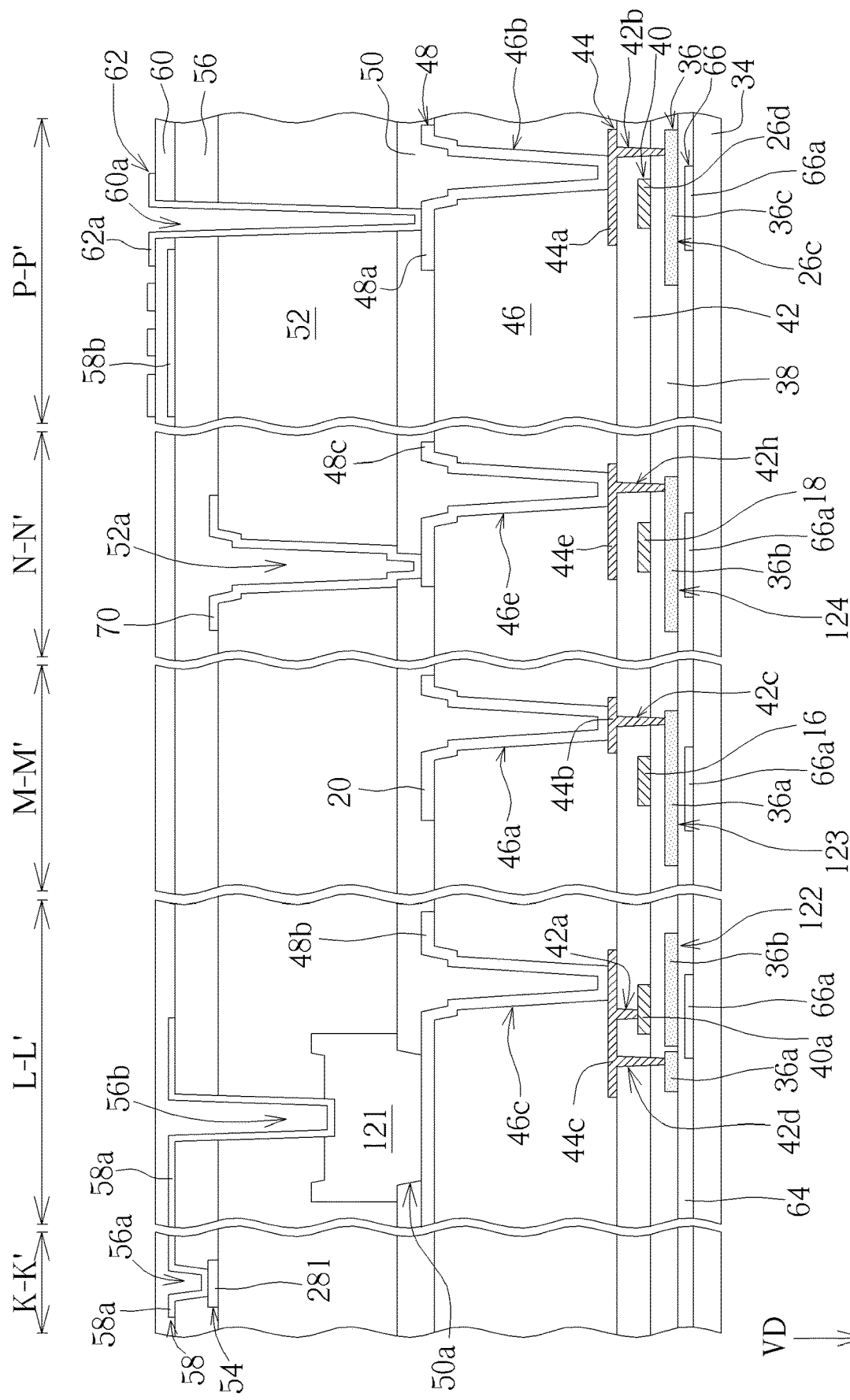
FIG. 11 schematically illustrates cross-sectional structures of the electronic device taken along a line K-K', a line L-L', a line M-M', a line N-N', and a line P-P' according to the second embodiment of the present disclosure.

FIG. 10 schematically illustrates a top view structure of the electronic device in the sensing region according to the second embodiment of the present disclosure, and FIG. 11 schematically illustrates cross-sectional structures of the electronic device taken along a line K-K', a line L-L', a line M-M', a line N-N', and a line P-P' according to the second embodiment of the present disclosure. As shown in FIG. 10 and FIG. 11, the electronic device 2 of this embodiment differs from the electronic device 1 of FIG. 4 and FIG. 5 in that the metal layer 44 may further include an electrode 44e, and the metal layer 48 may further include an electrode 48c, such that one end portion of the semiconductor block 36b (i.e., the second end of one of the transistors 124) may be coupled to the readout line 70 through the electrode 44e and the electrode 48c. Specifically, the electrode 44e may be separated from the signal lines 26e. The insulating layer 42 and the insulating layer 38 may have a through hole 42h exposing one end portion of the semiconductor block 36b, and the electrode 44e extends to the through hole 42h to be coupled to the semiconductor block 36b. The insulating layer 46 may have a through hole 46e exposing the electrode 44e, and the electrode 48c may extend into the through hole 46e to be coupled to the electrode 44e. The insulating layer 52 may have a through hole 52a exposing the electrode 48c, and a portion of the readout line 70 may extend into the through hole 52a to be coupled to the electrode 48c, so that the second end of one of the transistors 124 may be coupled to the readout line 70. In the embodiment of FIG. 10 and FIG. 11, the readout line 70 may for example replace the touch signal line 281 in FIG. 4 and be included in the metal layer 54. In addition, the readout line 70 may for example overlap the corresponding signal line 26e in the top view direction VD, but not limited thereto. The parts of FIG. 11 taken along the line K-K', the line L-L', the line M-M' and the line P-P' of FIG. 10 may for example be the same as the parts of FIG. 5 taken along the line B-B', the line C-C', the line D-D' and the line E-E' of FIG. 4 respectively. Structures of other parts of the electronic device 2 in this embodiment may be similar to or the same as the electronic device 1 shown in FIG. 4 and FIG. 5 and will not be mentioned again.

Figure 12:
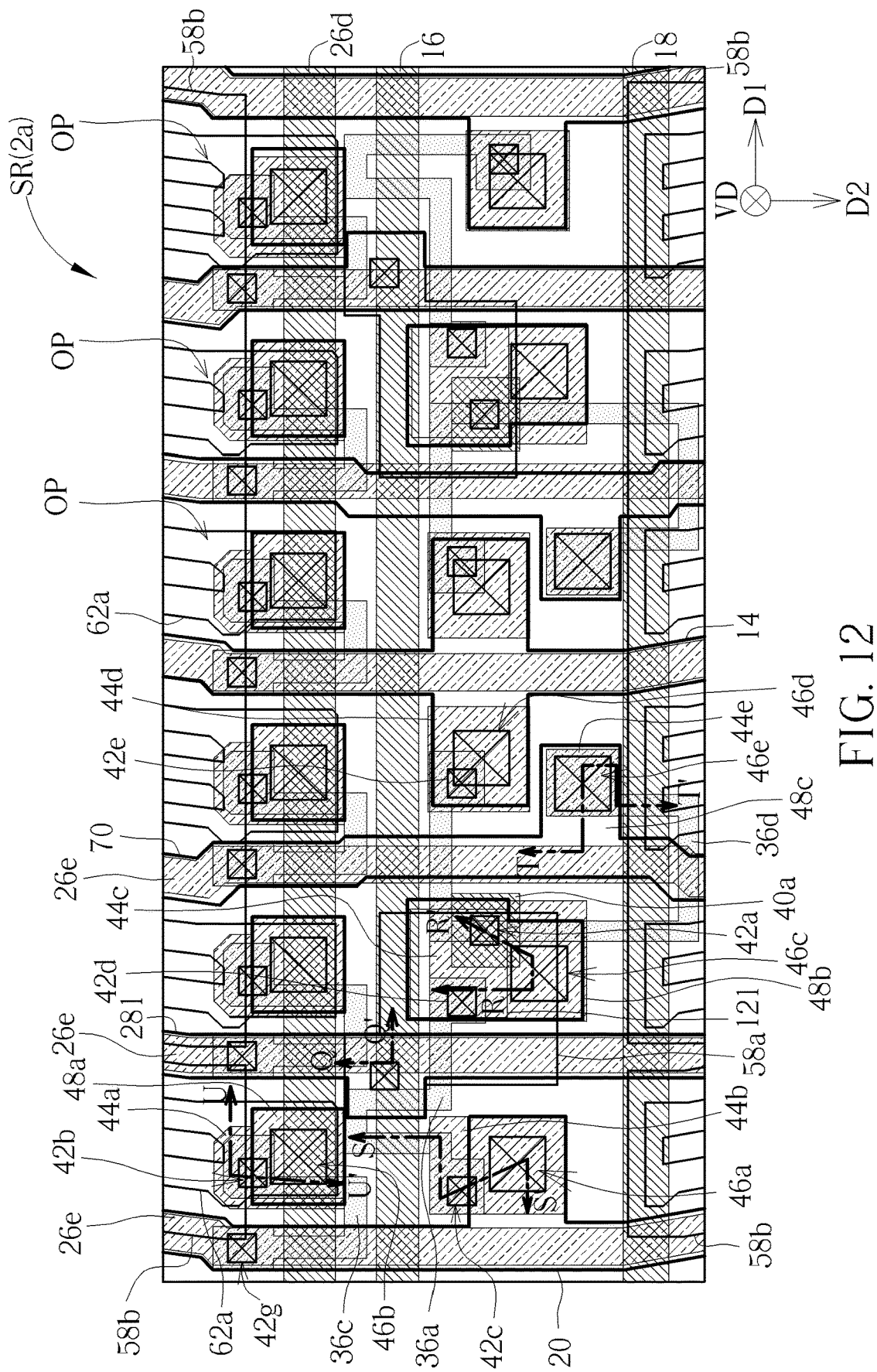
FIG. 12 schematically illustrates a top-view structure of an electronic device in a sensing area according to a variant embodiment of the second embodiment of the present disclosure.
Figure 13:
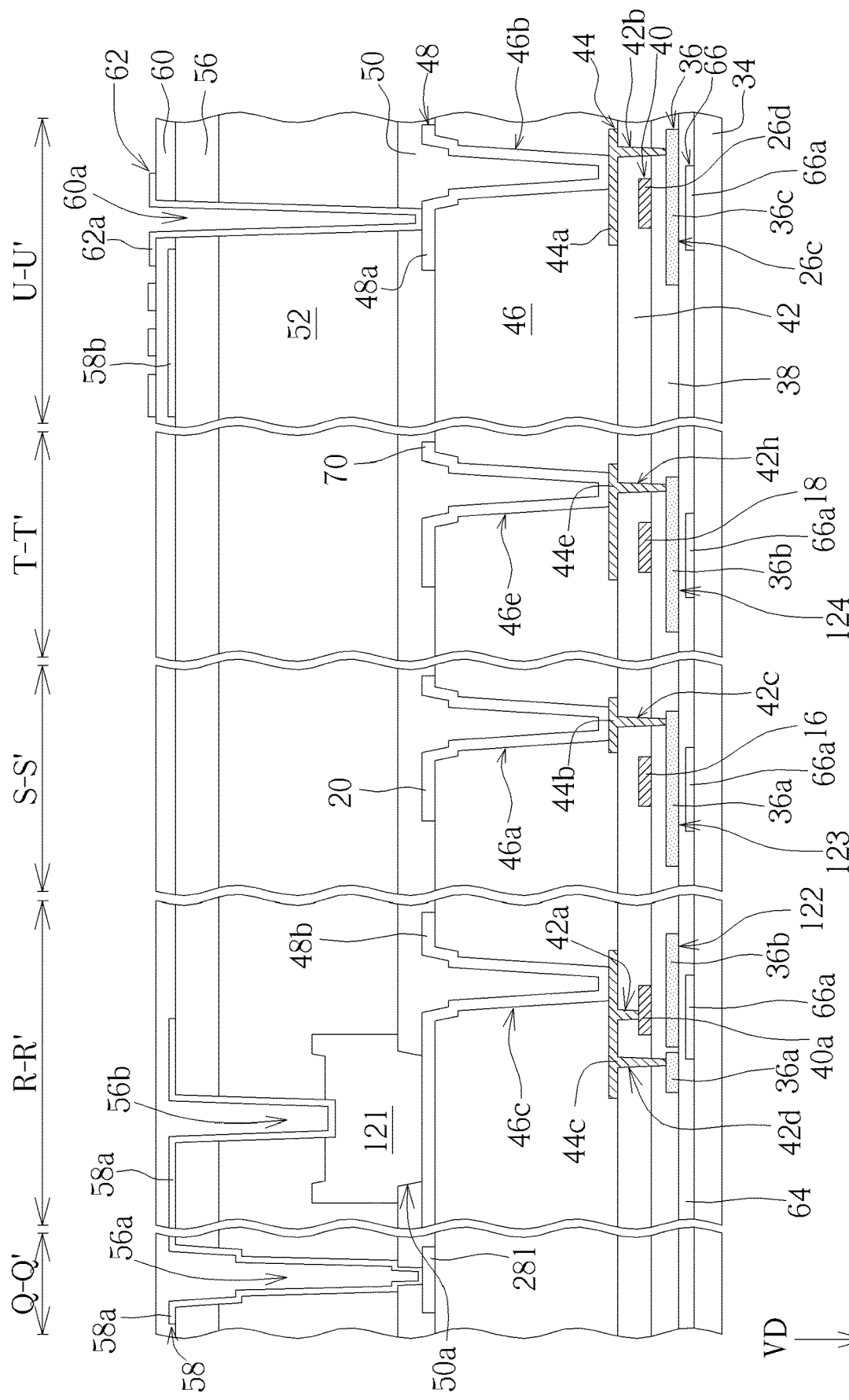
FIG. 13 schematically illustrates cross-sectional views of the electronic device taken along a line Q-Q', a line R-R', a line S-S' and a line T-T' of FIG. 12 according to the variant embodiment of the second embodiment of the present disclosure.

FIG. 12 schematically illustrates a top-view structure of an electronic device in a sensing area according to a variant embodiment of the second embodiment of the present disclosure, and FIG. 13 schematically illustrates cross-sectional views of the electronic device taken along a line Q-Q', a line R-R', a line S-S' and a line T-T' of FIG. 12 according to the variant embodiment of the second embodiment of the present disclosure. As shown in FIG. 12 and FIG. 13, the electronic device 2a of this variant embodiment differs from the electronic device 2 of FIG. 10 and FIG. 11 in that the structure of the electronic device 2a may not include the metal layer 54. In such case, as shown in parts of FIG. 13 taken along the line Q-Q' and the line T-T' of FIG. 12, the metal layer 48 may further include the touch signal line 281 and the readout line 70. In the embodiment of FIG. 13, the through hole 56a may penetrate through the insulating layer 56, the insulating layer 52 and the insulating layer 50 to expose the touch signal line 281, and the connecting electrode 58a may extend into the through hole 56a to be coupled to the touch signal line 281. Accordingly, the sensing unit 121 may be coupled to the touch signal line 281 through the connecting electrode 58a. In the embodiment of FIG. 12, the touch signal line 281 and the electrode 48b may be separated from each other in the top view direction VD. The structures and circuits of other parts of the electronic device 2a of this variant embodiment may for example be similar to or the same as the electronic device 2 shown in FIG. 8, FIG. 10 and FIG. 11 and thus will not be described in detail.

Figure 14:
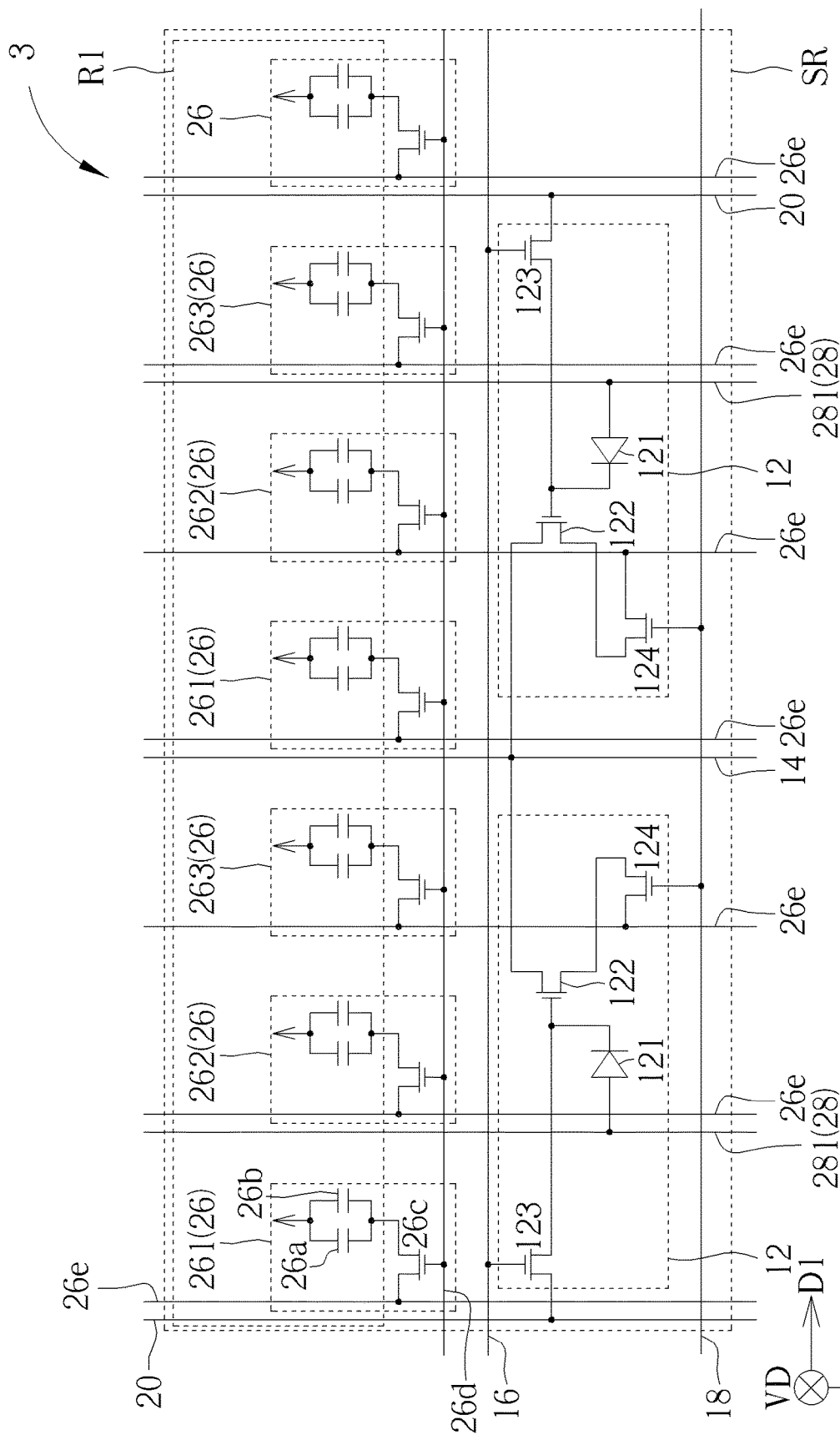
FIG. 14 schematically illustrates a circuit of an electronic device according to a third embodiment of the present disclosure.

FIG. 14 schematically illustrates a circuit of an electronic device according to a third embodiment of the present disclosure. As shown in FIG. 14, the electronic device 3 of this embodiment differs from the electronic device 1 shown in FIG. 1 in that the touch signal line 281 of the electronic device 3 may replace the signal line 22 of FIG. 1. The touch signal line 281 in FIG. 14 may be similar to or the same as the touch signal line 281 in FIG. 8 and thus will not be described in detail. In the embodiment of FIG. 14, the electronic device 3 may not include the readout line 70 of FIG. 8, and the second end of the transistor 124 of one of the sensing circuits 12 may be coupled to the signal line 26e (e.g., the data line) of a corresponding one of the pixel circuits 26, so that the second end of the transistor 124 and the corresponding transistor 26c may be coupled to the same signal line 26e. It should be noted that other parts of circuits of the electronic device 3 in this embodiment may for example be similar to or the same as the electronic device 1 shown in FIG. 1 and will not be described again. The structure of the electronic device 3 in this embodiment may be similar to or the same as the structure of the electronic device 1 shown in FIG. 4 to FIG. 5 while the signal line 22 is replaced with the touch signal line 281 and will not be mentioned again.

In summary, in the electronic device of the present disclosure, the number of the signal lines or the power lines disposed along the second direction in the electronic device may be reduced to increase the pixel aperture ratio of the electronic device by coupling two adjacent sensing circuits to the same power line, coupling one of the transistors of the sensing circuits to the corresponding signal line of the pixel circuits and/or integrating another signal line into the touch signal line. In some embodiments, the pixel aperture ratio of the electronic device may also be improved by the overlapping of the power line, the signal line and/or the touch signal line of one of the sensing circuits with the corresponding signal lines of the pixel circuits respectively in the top view direction.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a first sensing circuit, comprising:
      a first sensing unit; and
      a first transistor, wherein a first end of the first sensing unit is coupled to a control end of the first transistor;
   a second sensing circuit, comprising:
      a second sensing unit; and
      a second transistor, wherein a first end of the second sensing unit is coupled to a control end of the second transistor; and
   a power line, wherein a first end of the first transistor and a first end of the second transistor are coupled to the power line, and the power line is disposed between the first sensing circuit and the second sensing circuit.

2. The electronic device according to claim 1, further comprising a pixel circuit comprising a signal line, wherein the first sensing circuit further comprises a third transistor, a second end of the first transistor is coupled to a first end of the third transistor, and a second end of the third transistor is coupled to the signal line.

3. The electronic device according to claim 2, wherein the signal line is a data line.

4. The electronic device according to claim 2, wherein the pixel circuit further comprises a fourth transistor, and a first end of the fourth transistor is coupled to the signal line.

5. The electronic device according to claim 1, further comprising a touch circuit comprising a touch signal line coupled to a second end of the first sensing unit.

6. The electronic device according to claim 1, further comprising a readout line, wherein the first sensing circuit further comprises a third transistor, a second end of the first transistor is coupled to a first end of the third transistor, and a second end of the third transistor is coupled to the readout line.

7. The electronic device according to claim 1, wherein the first sensing circuit further comprises a signal line coupled to a second end of the first sensing unit, and the signal line and the power line extend along a same direction.

8. The electronic device according to claim 1, further comprising another power line, wherein the first sensing circuit further comprises a fifth transistor, a first end of the fifth transistor is coupled to the control end of the first transistor, and a second end of the fifth transistor is coupled to the another power line.

9. An electronic device, comprising:
   a pixel circuit comprising a first transistor and a signal line, wherein the signal line is coupled to a first end of the first transistor; and
   a sensing circuit comprising a sensing unit, a second transistor and a third transistor, wherein a first end of the sensing unit is coupled to a control end of the second transistor, a second end of the second transistor is coupled to a first end of the third transistor, and a second end of the third transistor is coupled to the signal line.

10. The electronic device according to claim 9, wherein the signal line is a data line.

11. An electronic device, comprising:
    a sensing circuit, comprising:
       a sensing unit;
       a first transistor, wherein a first end of the sensing unit is coupled to a control end of the first transistor; and
       a second transistor, wherein a first end of the first transistor is coupled to a first end of the second transistor;

a touch circuit comprising a touch signal line, wherein the touch signal line is coupled to a second end of the sensing unit; and a signal line, wherein a control end of the second transistor is coupled to the signal line.

12. The electronic device according to claim 11, further comprising a pixel circuit comprising another signal line, wherein a second end of the second transistor is coupled to the another signal line.

13. The electronic device according to claim 12, wherein the another signal line is a data line.

14. The electronic device according to claim 12, wherein the another signal line and the touch signal line extend along a same direction.

15. The electronic device according to claim 11, further comprising a readout line, wherein a second end of the second transistor is coupled to the readout line.

16. The electronic device according to claim 15, further comprising a pixel circuit comprising a third transistor and another signal line, wherein a first end of the third transistor is coupled to the another signal line.

17. The electronic device according to claim 11, further comprising a power line, wherein a second end of the first transistor is coupled to the power line.

18. The electronic device according to claim 11, further comprising another power line, wherein the sensing circuit further comprises a fourth transistor, a first end of the fourth transistor is coupled to the control end of the first transistor, and a second end of the fourth transistor is coupled to the another power line.

19. The electronic device according to claim 17, further comprising another signal line coupled to a control end of the fourth transistor, wherein the another signal line crosses the touch signal line.

* * * * *